(12) United States Patent
Mullen

(10) Patent No.: US 7,250,122 B2
(45) Date of Patent: *Jul. 31, 2007

(54) DIFFERENTIALLY CURED MATERIALS AND PROCESS FOR FORMING SAME

(75) Inventor: Patrick W. Mullen, Barkhamsted, CT (US)

(73) Assignee: Reflexite Corporation, Avon, CT (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/928,247

(22) Filed: Aug. 10, 2001

(65) Prior Publication Data

US 2002/0051866 A1    May 2, 2002

Related U.S. Application Data (60) Provisional application No. 60/226,697, filed on Aug. 18, 2000, provisional application No. 60/256,176, filed on Dec. 15, 2000.

(51) Int. Cl.
*B29D 11/00*    (2006.01)

(52) U.S. Cl. .................. 264/1.38; 264/1.6; 264/1.7; 264/495; 264/496

(58) Field of Classification Search ............ 214/494, 214/496, 1.7, 1.36, 1.38; 425/174.4, 808, 425/810; 264/1.1, 1.6, 1.7, 1.36, 1.38, 494, 264/495, 496

See application file for complete search history.

(56) References Cited

U.S. PATENT DOCUMENTS

| | | |
|---|---|---|
| 1,241,886 A | 10/1917 | Rowe |
| 2,248,638 A | 7/1941 | Merton |
| 2,310,790 A | 2/1943 | Jungersen |
| 2,380,447 A | 7/1945 | Jungersen |
| 2,474,317 A | 6/1949 | McPhail |
| 2,904,673 A | 9/1959 | Guth, Sr. |
| 3,670,260 A | 6/1972 | Koester et al. |
| 3,684,348 A | 8/1972 | Rowland ............ 350/103 |

(Continued)

FOREIGN PATENT DOCUMENTS

JP    8-137375    * 5/1996

(Continued)

OTHER PUBLICATIONS

Patent Abstracts of Japan for Japanese Patent Publication No. 2000210963, Published Aug. 2, 2000.

(Continued)

*Primary Examiner*—Mathieu D. Vargot
(74) *Attorney, Agent, or Firm*—Hamilton, Brook, Smith & Reynolds, P.C.

(57) ABSTRACT

A structure includes a layer which includes a first cured portion and a second cured portion which are formed from a same light curable material. The first cured portion is cured to a first amount, and the second cured portion is cured to a second amount. The first amount is sufficiently different than the second amount to result in a visible discontinuity on the surface of the structure.

A method for forming a pattern in a radiation curable material includes providing between a radiation source and the radiation curable material, a pattern that can block a portion of the radiation from the radiation source. The material is cured with radiation from the radiation source to form a pattern in the radiation curable material.

13 Claims, 8 Drawing Sheets

U.S. PATENT DOCUMENTS

| | | | |
|---|---|---|---|
| 3,712,706 A | 1/1973 | Stamm | 350/103 |
| 3,718,078 A | 2/1973 | Plummer | |
| 3,853,578 A * | 12/1974 | Suzuki et al. | 427/510 |
| 4,013,465 A | 3/1977 | Clapham et al. | 96/36 |
| 4,064,433 A | 12/1977 | Korn | |
| 4,154,219 A | 5/1979 | Gupta et al. | |
| 4,242,723 A | 12/1980 | Fabbri et al. | |
| 4,260,220 A | 4/1981 | Whitehead | |
| 4,374,077 A | 2/1983 | Kerfeld | |
| 4,402,571 A | 9/1983 | Cowan et al. | |
| 4,469,407 A | 9/1984 | Cowan et al. | |
| 4,477,529 A | 10/1984 | Campbell | |
| 4,485,123 A | 11/1984 | Troue | 427/54.1 |
| 4,496,216 A | 1/1985 | Cowan | |
| 4,514,345 A | 4/1985 | Johnson et al. | 264/22 |
| 4,542,449 A | 9/1985 | Whitehead | |
| 4,576,850 A | 3/1986 | Martens | 428/156 |
| 4,732,715 A * | 3/1988 | Bawa et al. | |
| 4,791,540 A | 12/1988 | Dreyer, Jr. et al. | |
| 4,839,250 A | 6/1989 | Cowan | |
| 4,874,213 A | 10/1989 | Cowan | |
| 4,874,228 A | 10/1989 | Aho et al. | |
| 4,883,341 A | 11/1989 | Whitehead | |
| 4,888,260 A | 12/1989 | Cowan | |
| 4,906,070 A | 3/1990 | Cobb, Jr. | |
| 4,937,716 A | 6/1990 | Whitehead | |
| 4,984,144 A | 1/1991 | Cobb, Jr. et al. | 362/339 |
| 4,999,234 A | 3/1991 | Cowan | |
| 5,005,108 A | 4/1991 | Pristash et al. | 362/31 |
| 5,015,524 A | 5/1991 | Kobayashi et al. | |
| 5,056,892 A | 10/1991 | Cobb, Jr. | 359/831 |
| 5,093,765 A | 3/1992 | Kashima et al. | |
| 5,126,882 A | 6/1992 | Oe et al. | |
| 5,161,041 A | 11/1992 | Abileah et al. | |
| 5,175,030 A | 12/1992 | Lu et al. | 428/30 |
| 5,183,597 A | 2/1993 | Lu | 264/1.4 |
| 5,186,530 A | 2/1993 | Whitehead | |
| 5,190,370 A | 3/1993 | Miller et al. | |
| 5,267,062 A | 11/1993 | Bottorf | |
| 5,289,351 A | 2/1994 | Kashima et al. | |
| 5,394,255 A | 2/1995 | Yokota et al. | 359/49 |
| 5,396,350 A | 3/1995 | Beeson et al. | |
| 5,442,523 A | 8/1995 | Kashima et al. | |
| 5,521,797 A | 5/1996 | Kashima et al. | |
| 5,550,676 A | 8/1996 | Ohe et al. | |
| 5,565,151 A | 10/1996 | Nilsen | |
| 5,579,134 A | 11/1996 | Lengyel | |
| 5,592,332 A | 1/1997 | Nishio et al. | |
| 5,598,280 A | 1/1997 | Nishio et al. | |
| 5,600,462 A | 2/1997 | Suzuki et al. | 349/112 |
| 5,629,784 A | 5/1997 | Abileah et al. | |
| 5,635,278 A | 6/1997 | Williams | |
| 5,670,096 A | 9/1997 | Lu | 264/1.1 |
| 5,711,589 A | 1/1998 | Oe et al. | |
| 5,716,681 A | 2/1998 | Williams | |
| 5,721,603 A | 2/1998 | De Vaan et al. | |
| 5,724,108 A | 3/1998 | Shibata | |
| 5,730,518 A | 3/1998 | Kashima et al. | |
| 5,769,522 A | 6/1998 | Kaneko et al. | 362/31 |
| 5,771,328 A | 6/1998 | Wortman et al. | 385/146 |
| 5,780,140 A * | 7/1998 | Nilsen | |
| 5,816,677 A | 10/1998 | Kurematsu et al. | |
| 5,838,403 A | 11/1998 | Jannson et al. | |
| 5,844,720 A | 12/1998 | Ohara et al. | |
| 5,851,062 A | 12/1998 | Shinohara et al. | |
| 5,857,561 A | 1/1999 | Hardman et al. | 198/846 |
| 5,863,113 A | 1/1999 | Oe et al. | |
| 5,917,664 A | 6/1999 | O'Neill et al. | |
| 5,919,551 A | 7/1999 | Cobb, Jr. et al. | |
| 5,932,626 A | 8/1999 | Fong et al. | 522/182 |
| 5,946,991 A | 9/1999 | Hoopman | |
| 5,995,690 A | 11/1999 | Kotz et al. | |
| 6,052,164 A | 4/2000 | Cobb, Jr. et al. | |
| 6,075,649 A | 6/2000 | Naito | |
| 6,114,010 A | 9/2000 | Williams | |
| 6,147,804 A | 11/2000 | Kashima et al. | |
| 6,164,782 A | 12/2000 | Pojar | |
| 6,239,851 B1 | 5/2001 | Hatazawa et al. | |
| 6,277,471 B1 | 8/2001 | Tang | |
| 6,280,063 B1 | 8/2001 | Fong et al. | |
| 6,322,236 B1 | 11/2001 | Campbell et al. | |
| 6,354,709 B1 | 3/2002 | Campbell et al. | |
| 6,356,389 B1 | 3/2002 | Nilsen et al. | |
| 6,357,888 B1 | 3/2002 | Takata et al. | |
| 6,359,735 B1 | 3/2002 | Gombert et al. | |
| 6,570,710 B1 | 5/2003 | Nilsen et al. | |
| 6,576,887 B2 | 6/2003 | Whitney et al. | |
| 6,588,883 B2 | 7/2003 | Nakatani et al. | |
| 6,673,425 B1 | 1/2004 | Hebrink et al. | |
| 6,787,202 B2 | 9/2004 | Mizutani et al. | |
| 6,845,212 B2 | 1/2005 | Gardiner et al. | |
| 2002/0051866 A1 | 5/2002 | Mullen | |
| 2002/0057497 A1 | 5/2002 | Gardiner et al. | |
| 2003/0103760 A1 | 6/2003 | Gardiner et al. | |
| 2003/0214728 A1 | 11/2003 | Olczak | |

FOREIGN PATENT DOCUMENTS

| | | |
|---|---|---|
| JP | 8137375 | 5/1996 |
| JP | 2000210963 | 2/2000 |
| WO | WO 97/28468 | 8/1997 |
| WO | WO 97/30604 | 8/1997 |
| WO | WO 99/42861 | 8/1999 |
| WO | WO 01/27527 A1 | 4/2001 |
| WO | WO 01/35128 | 5/2001 |
| WO | WO 02/04858 A2 | 1/2002 |
| WO | WO 02/16106 A2 | 2/2002 |
| WO | WO 02/34514 A1 | 5/2002 |

OTHER PUBLICATIONS

Avrutsky, Ivan A. et al., "Multiwavelength Diffraction and Apodization Using Binary Superimposed Gratings," *IEEE Photonics Technology Letters*, 10(6):839-841 (1998).

Cowan, James J., "Aztek surface-relief volume diffractive structure," *Journal of the Optical Society of America A*, 7(8):1529-1544 (1990).

Cowan, James J., "The Holographic Honeycomb Microlens," *Proceedings of SPIE—The International Society for Optical Engineering*, 523:251-259 (1985).

Francon, M., *Optical Interferometry*, pp. 40-41 (1966).

Guerra, John M., P.E., President, "Preliminary Report: Suitability of PTM to Analysis of Optikos Sample," Optikos Corp. and Nanoptek Corp. (2002).

Jenkins, Francis A. et al., *Fundamentals of Optics*, Third Edition, 2 pages (1957).

Mihailov, Stephen J. et al., "Apodization technique for fiber grating fabrication with a halftone transmission amplitude mask," *Applied Optics*, 39(21):3670-3677 (2000).

\* cited by examiner

DIFFERENTIALLY CURED MATERIALS AND PROCESS FOR FORMING SAME

RELATED APPLICATIONS

This application claims the benefit of U.S. Provisional Application No. 60/226,697, filed on Aug. 18, 2000, and U.S. Provisional Application No. 60/256,176, filed on Dec. 15, 2000. The entire teachings of the above applications are incorporated herein by reference.

BACKGROUND OF THE INVENTION

Many retroreflective sheeting, collimating films, etc. are made to exacting dimensions in metal molds that are difficult and expensive to make. The metal molds can represent a significant barrier of entry into a high quality market for sheeting and films. However, knock-off manufacturers of retroreflective sheeting and collimating film can form inexpensive, low quality molds from the high quality sheeting and film. As a means to deter such copying, the metal molds are often engraved with a company logo or trademark, which can cause the logo or trademark to appear on the knock-off end product. A disadvantage of the added logo is that it can be more difficult to engrave at the tolerances required.

Therefore, a need exists for better marked products and a method of marking products better.

SUMMARY OF THE INVENTION

A structure includes a layer which includes a first cured portion and a second cured portion which are formed from a same light curable material. The first cured portion is cured to a first amount, and the second cured portion is cured to a second amount. The first amount is sufficiently different than the second amount to result in a visible discontinuity on the surface of the structure. The layer can be connected to a base. The layer and the base can be formed of the same material. The first amount of curing can be sufficiently different than the second amount of curing to result in a difference in the thickness of the first portion and the thickness of the second portion that is in a range of between about 0.05 and 2.0 micrometers. A visible discontinuity is considered a rise or depression in the surface of a structure that causes incident light to display a different shade of light that when incident light strikes a portion of the surface not having a rise or depression. The visible discontinuity can be discerned with the naked eye. The layer can be a prism array, such as linear prisms or cube-corner prisms, a lenticular structure, or a sub-wavelength structure.

A method for forming a pattern in a radiation curable material includes providing between a radiation source and the radiation curable material a blocking pattern that can block a portion of the radiation from the radiation source. The material is cured with radiation from the radiation source through the blocking pattern to form a pattern in the radiation curable material.

A pattern transfer structure includes a radiation source for emitting radiation, a radiation curable material that can be cured by the radiation and a pattern for blocking a portion of the radiation. The pattern is disposed between the radiation source and the radiation curable material during the curing of the material such that a pattern is formed in the material.

A method for forming a prism structure includes providing a prism mold and placing a radiation curable material in the mold. A pattern is provided between a radiation source and the radiation curable material that can block a portion of the radiation curable material. The radiation curable material is cured with radiation from the radiation source to form a pattern in the radiation curable material.

A prism structure includes a base and a prism array connected to the base. The prism array includes a first cured portion and a second cured portion which are formed from a same radiation curable material. The first cured portion has a first index of refraction value and the second cured portion has a second index of refraction value which is sufficiently different from the first index of refraction value to result in a visible discontinuity on the surface of the structure.

The invention has many advantages including forming a permanent pattern in materials that are transparent and do not significantly detract from other functions. The material can have the pattern act similar to a watermark in paper to provide a means of identification for a product's source that is difficult to forge. Also the pattern can serve as a function of light management by altering the path of light that is transmitted through such a structure having the pattern.

The foregoing and other objects, features and advantages of the invention will be apparent from the following more particular description of preferred embodiments of the invention, as illustrated in the accompanying drawings in which like reference characters refer to the same parts throughout the different views. The drawings are not necessarily to scale, emphasis instead being placed upon illustrating the principles of the invention. All parts and percentages are by weight unless otherwise specified.

DETAILED DESCRIPTION OF THE INVENTION

A description of preferred embodiments of the invention follows. Generally, the invention is directed to forming a pattern in a radiation curable material. The pattern, in one embodiment, is transparent when viewed in a direction substantially normal to the material. However, the pattern can be seen more clearly at a viewing angle of about fifteen degrees from the normal.

Figure 1:
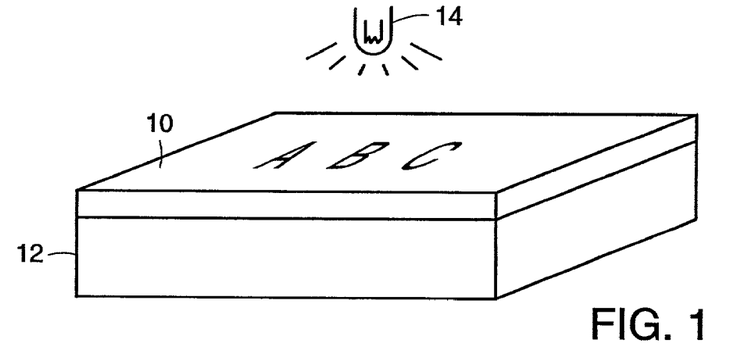
FIG. 1 shows an isometric view of a radiation curable material and a pattern layer positioned thereover for forming a pattern in the curable material.

FIG. 1 illustrates an embodiment of the present invention for forming a pattern, such as exemplary pattern "ABC"

provided by, for example, mask or pattern layer 10, disposed between a radiation source 14 and a radiation curable material 12. In one embodiment, the mask layer 10 can include polycarbonate, polyethylene, polybutylene or the like, and may include a low-tack adhesive. The curable material 12 can include coatings and microstructured or patterned materials formulated from materials, such as polyester, urethane, or epoxy acrylates and methacrylates. Various additives including fillers, free-radical initiators and cationic initiators can be included in the material 12 to improve processing or performance. See, for example, Sartomer Company Bulletin Nos. 4018 or 4303, the teachings of which are incorporated by reference. The radiation source 14 preferably provides actinic radiation, which causes photochemical activity in the curable material 12. For example, typical ultraviolet light can be used.

The pattern layer 10 can include any kind of material that blocks at least a portion of the radiation from the radiation source to leave a similar pattern in the cured material 12. For example, the pattern can be formed by a colored pattern, such as, using common printing inks, printed on a transparent polymer film. The pattern can also be formed by embossing patterns that effect the transparency of the film. In one embodiment, the pattern can be applied directly on either side of a substrate which carries the curable material 12 and after curing, the pattern may or may not be removed to leave the cured pattern in the cured layer 12. In alternative embodiments, the pattern layer 10 can include a stencil or the like, such as a colored or semi-transparent film material or a clear resin with ultraviolet blocking chemical therein.

Figure 2:
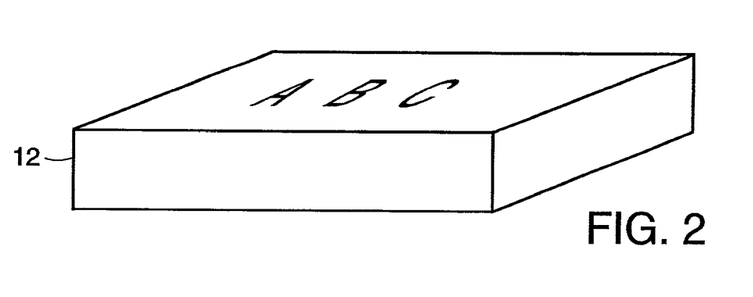
FIG. 2 shows an isometric view of the radiation curable material having a pattern formed therein.

As shown in FIG. 2, the pattern layer 10 has been removed but the pattern "ABC" has been transferred to the cured material 12. It is believed that the pattern changes the curing rate of the material 12 to form the pattern in the cured material. One theory suggests that the molecules in the formed pattern are denser as the molecules have a longer time to cross-link than the molecules which do not have a mask thereover. These denser regions appear to have different indices of refraction. The pattern is best viewed at an angle of about fifteen degrees.

Figure 3:
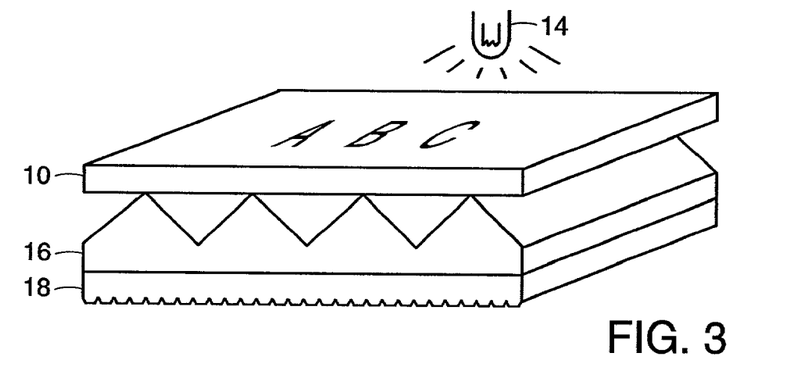
FIG. 3 shows an isometric view of a retroreflective structure having moth-eye structures formed thereon, the moth-eye structures having a pattern formed therein in accordance with another embodiment of the invention.

FIG. 3 illustrates another embodiment for forming a pattern in a material. In this embodiment, a pattern layer 10 is positioned over a cured retroreflective structure 16 which can contain, for example, linear or cube-corner prisms. Examples of suitable cube-corner prisms are disclosed in U.S. Pat. No. 3,684,348, issued to Rowland on Aug. 15, 1972, the teachings of which are incorporated herein by reference.

Moth-eye structures 18 can be formed on the opposite side of the retroreflective structure 16 as shown in FIG. 3. Moth-eye structures are explained in more detail in U.S. application Ser. No. 09/438,912, filed on Nov. 12, 1999, which corresponds to International Publication No. WO 01/35128, published on May 17, 2001. The teachings of each are incorporated herein in their entirety. The moth-eye structures 18 are cured by the radiation source 14 through the pattern layer 10 such that the pattern is formed in the moth-eye structures 18 or diffusing structure or other suitable structures.

A sub-wavelength structure applied preferably has an amplitude of about 0.4 microns and a period of less than about 0.3 microns. The structure is sinusoidal in appearance and can provide a deep green to deep blue color when viewed at grazing angles of incidence. Preferably, the amplitude is greater than two times the period to provide a two or greater to one aspect ratio.

To form a sub-wavelength structure, the structure is first produced on a photo resist-covered glass substrate by a holographic exposure using an ultraviolet laser. A suitable device is available from Holographic Lithography Systems of Bedford, Mass. An example of a method is disclosed in U.S. Pat. No. 4,013,465, issued to Clapham et al. on Mar. 22, 1977, the teachings of which are incorporated herein by reference. This method is sensitive to any changes in the environment, such as temperature and dust, and care must taken. The structure is then transferred to a nickel shim by an electroforming process.

In another embodiment, a fine pattern can be formed on the mask layer 10. For example, the pattern can be a few tenths of a millimeter or less in width. A curable material, which is preferably substantially clear when cured, is formed on the opposite side of the mask layer 10 of the pattern and cured by a radiation source 14. The fine pattern is thus transferred to the cured material. The mask layer 10 is removed and the cured sheet is placed in front of a display, such as a liquid crystal display. The fine pattern breaks up the pixel pattern in the display without as much light loss as with diffuser sheets.

In radiation cured casting processes where it is desirable to produce features with multiple angles, one normally cuts multiple angle features into the mold that is used for the reproduction of the features. This is commonly true in the manufacture of light guiding or light reflecting products where small angle changes can strongly affect the product performance. The cutting and replication of molds are costly and time consuming processes.

With this invention, one can produce a variety of angle and pattern variations in a product from a single mold design. One prints a "photomask" onto the surface of a carrier sheet or film prior to formation and radiation cure of a mold formed structure. The "photomask" can be clear or colored and be applied to either side of the carrier. If the curing radiation is highly collimated, it is desirable to have the "mask" be semi-transparent to allow for slow curing in that area. In cases where the radiation is less collimated, one can obtain cure through totally opaque masks via scattering and reflections into the masked area.

The resulting product then displays different optical behavior in areas that have been masked due to the variation in shrinkage and refractive index related to the speed of cure which is hindered by the "mask".

Figure 4:
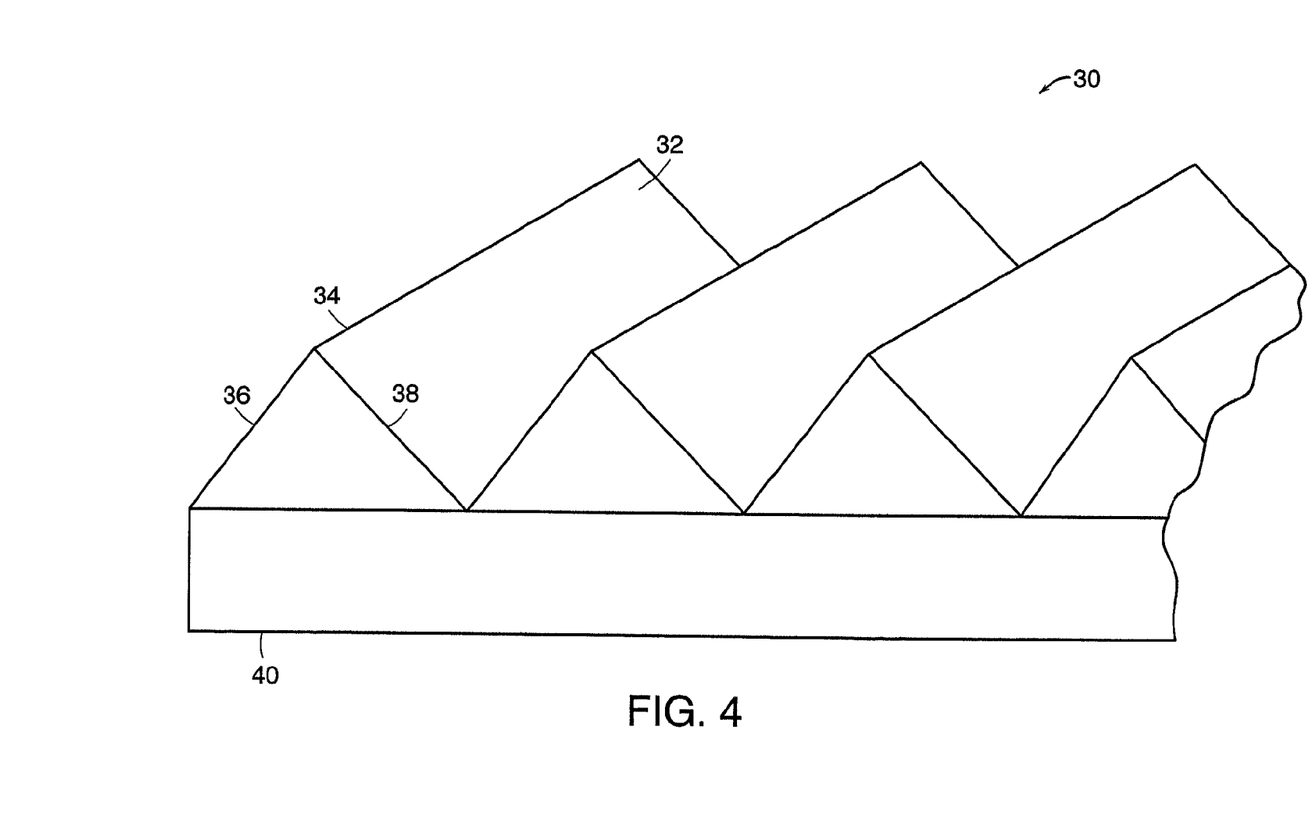
FIG. 4 shows a perspective view of a standard collimating film.

FIG. 4 shows a perspective view of a typical collimating film 30 with linear prisms 32 having linear peaks 34 and valleys 36. The dihedral angle of the first side 36 and second side 38 of the peak 34 is typically ninety degrees. However, it can be a non-right angle. The linear prisms 32 can be formed on a base film 40.

Figure 5:
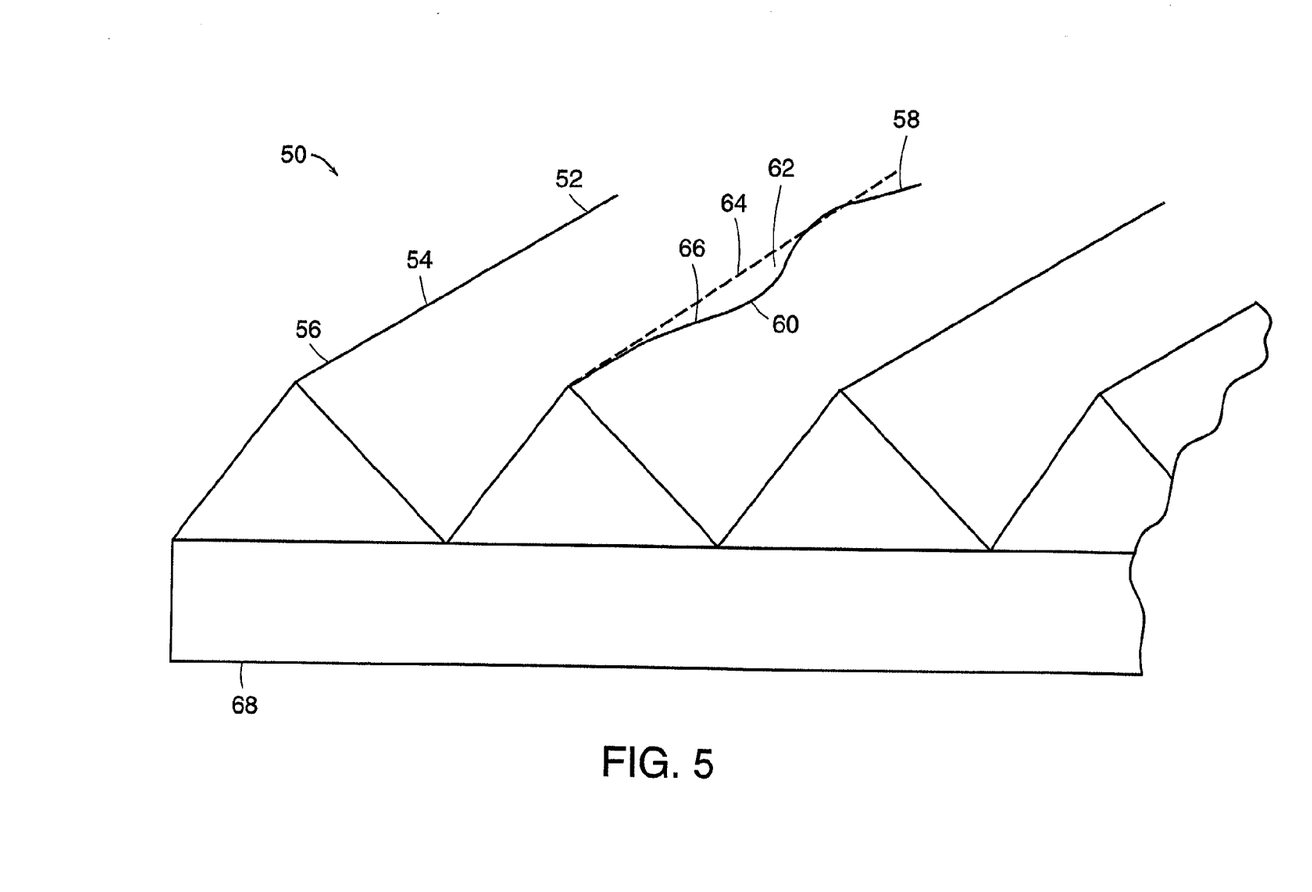
FIG. 5 shows a perspective view of a differentially cured collimating film.

FIG. 5 shows a perspective view of a prism array 52 of a differentially cured collimating film 50. Many of the prisms which are not blocked by a mask, such as prism 54, have a linear peak 56. Many of the prisms, which are blocked, such as prism 58, have a curved peak 60. The curved peak is the result of curing through a mask which reduces or increases the cure rate with respect to the surrounding areas. Typically, curved peak 60 is shaped compared to the normal apex of linear peak 56 of prism 58. The region 62 is curved in respect to another region which can result in a wider light distribution. The curved center line 66 of the peak in this prism can be off center in respect to the normal center line 64 depending upon the curing mask used. This region 62 also can have a slightly different index of refraction in respect to other areas. The prisms can be formed on a base film 68, such as a polyester, polycarbonate, polyurethane, acrylic and polyvinyl chloride. Preferably, the mask can cover up to about fifty percent of the area of the product to be formed, such as a collimating film. The shape of the differential cure area can be essentially any configuration or size. This allows one to tailor the light/distribution in specification areas of the sheet, such as to corners or edges, instead of the center of the sheet. Also, if a greater percentage of the area of the structure were blocked as compared to exposed to ultraviolet light, the exposed portion can result in raised portions or bumps. In structures where a lesser percentage of the area of the structure were blocked as compared to exposed to ultraviolet light, the structure can have an appearance with recesses.

In the area which was blocked, the prisms can have nanometer size striations caused by the differential cure shrinkage pattern. These striations can perform like a vertical linear moth-eye structure. Some striations can extend from the peak to valley. The striation can range in width of between about 250 and 770 nanometers depending on the mask pattern. The striations can cause upward light tunneling.

Many other types of prisms can be used including cube-corner prisms. Cube-corner or prismatic retroreflectors are described in U.S. Pat. No. 3,712,706, issued to Stamm on Jan. 23, 1973, the teachings of which are incorporated by reference herein. Generally, the prisms are made by forming a master negative die on a flat surface of a metal plate or other suitable material. To form the cube-corners, three series of parallel equidistance intersecting V-shaped grooves sixty degrees apart are inscribed in the flat plate. The die is then used to process the desired cube-corner array into a rigid flat plastic surface. Further details concerning the structures and operation of cube-corner microprisms can be found in U.S. Pat. No. 3,684,348, issued to Rowland on Aug. 15, 1972, the teachings of which are incorporated by reference herein. Also, the pattern transfer concept can include forming a structured coating onto a smooth surface and also forming a pattern structure onto a micro optical array of any type including submicron to micron size surfaces. Further, a pattern can be placed on plano surfaces, prism surfaces, lens structures, and others. The pattern can be random, ordered or designed to convey a message.

Figure 6:
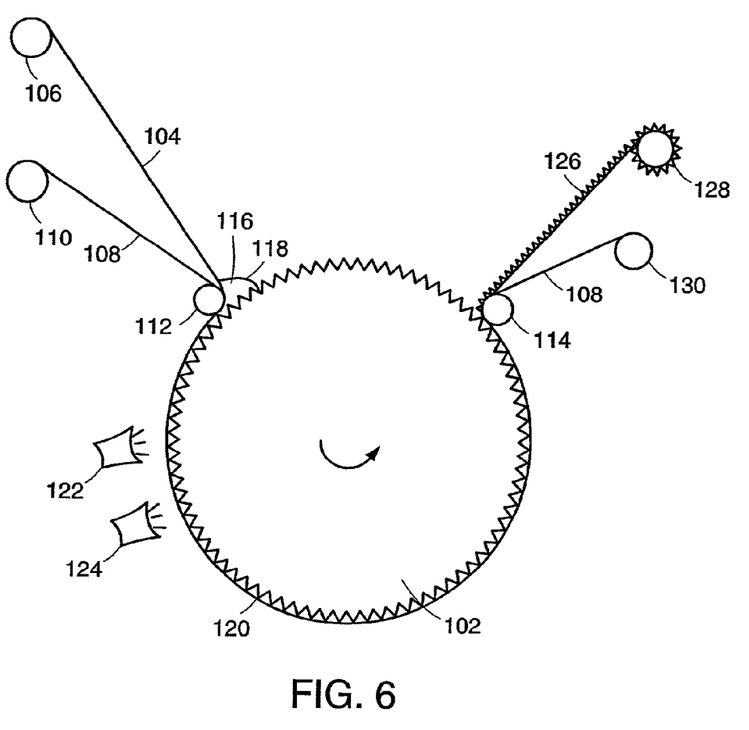
FIG. 6 shows a schematic view of a method for forming the differentially cured collimating film.

Referring now to FIG. 6, a method for forming the differentially cured collimating film will now be described in further detail. A mold 102 is ruled with linear grooves 120 essentially parallel to the axis about which the mold rotates. The linear grooves can be pitched between about 0.05 and 0.2 mm (0.002 and 0.008 inches). A base film 104 is unrolled from roll 106. The base film 104 can be a suitable material, such as a polyester. Mask film 108 is unrolled from second roll 110. Mask film can be formed of a suitable material, such as polyester, upon which a non-transparent design is printed on the transparent mask film. The non-transparent design can be printed on the mask film in the same manner as a design is printed on an overhead transparency. The base film 104 and mask film 108 are pinched together by first pinch roller 112 against roller 102. The base film 104 and mask film are kept in close contact with mold 102 until second pinch roller 114. In another embodiment, base film and mask film can be laminated together as a single sheet and then unrolled from a single roll.

In yet another embodiment, a removable pattern can be directly printed on a first side of the base film with a suitable light blocking material, such as a water soluble ink or the like. A curable layer of light curable material is placed on the second side of the base film, and the curable layer is differentially cured in the presence of light directed through the pattern and base film to the curable layer. After differentially curing the layer, the removable pattern is removed from the base film. For example, it can be removed with a solvent, such as water for a water soluble ink. However, other solvents can be used, such as alcohol, hydrocarbons, etc., depending upon the ink or other material used to form the light blocking pattern on the base film. An advantage of this embodiment is that a separate mask film is not needed.

Prism monomer material 116 is placed at point 118 proximate to pinch roller 112. The monomer material, such as an acrylic, flows into the grooves 120 of mold 102. The prism monomer material 116 is cured differentially by the partially blocked ultraviolet light as it passes ultraviolet lamps 122, 124, to form differentially cured collimating film 126. Differentially cured collimating film 126 is wound up on wind up roller 128. The mask film 108 is wound up on second wind up roller 130.

In a collimating film having portions that are differentially cured, light is directed through the collimating film that results in different shades of lighting. Lighter portions include the regions with ninety degree linear prisms. Regions with darker portions include the prisms that were differentially cured by blocking by the mask. In these darker portions, the prisms are slightly distorted due to the different cure rate and appear darker because the light is spread over a broader range.

A light directing film sheeting can be used for collimating light in backlighting systems. The light directing film sheeting 200, as shown in a cross-sectional side view in FIG. 7 and in a perspective view in FIG. 8, includes a base film 202 formed of a transparent polyester film, such as ICI Dupont 4000 PET, or polycarbonate, such as Rowland Technologies "Rowtec" film, having a thickness in the range of between about 50 and 250 micrometers (0.002 and 0.01 inches). In a preferred embodiment, the sheeting can have a thickness in the range of between about 0.1 and 0.15 mm and (0.004 and 0.006 inches) and an index of refraction in the range of between about 1.49 and 1.59.

Figure 7:
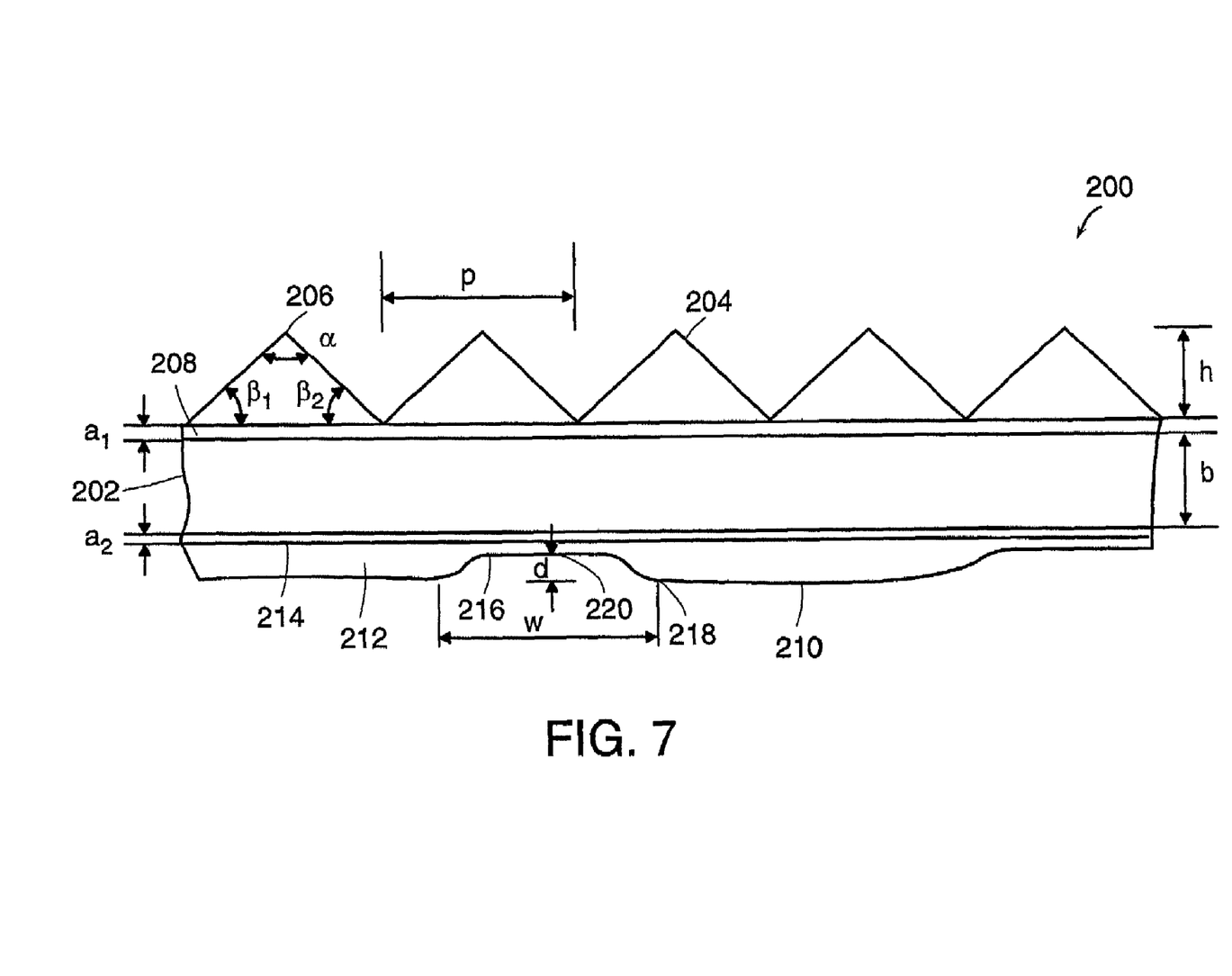
FIG. 7 shows a cross-sectional view of another embodiment.
Figure 8:
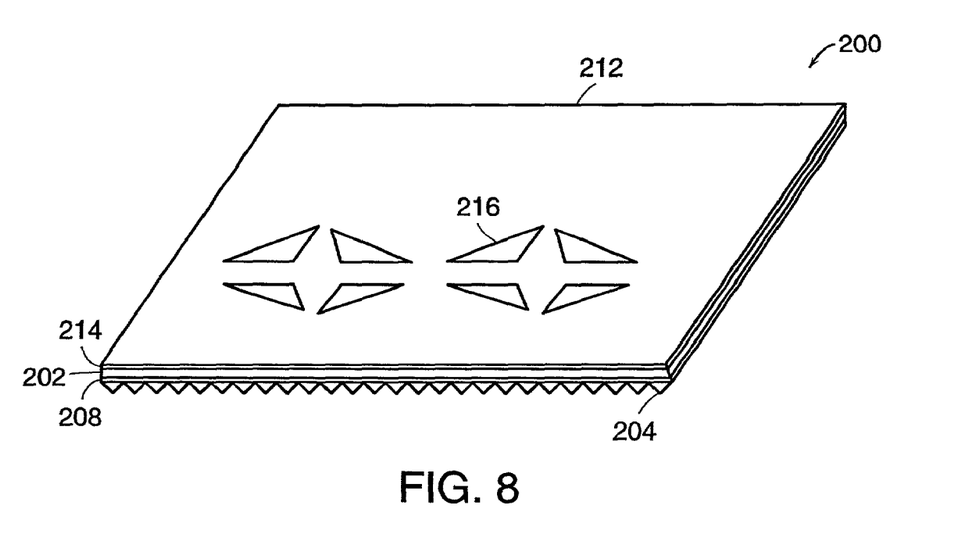
FIG. 8 shows a perspective view of the embodiment in FIG. 7.

A series of transparent linear prisms 204 having sides 206 are formed over the base film 202. Sides 206 can be isosceles. The linear prisms 204 extend across the sheeting. The prisms are formed of a transparent resin, such as a mixture of polymerized CN104 polyacrylate available from Sartomer Chemical Co. and RDX51027 from UCB Chemical. The linear prisms are pitched a distance (p) in a range of between about 25 and 100 micrometers (0.001 and 0.004 inches), preferably about 48 micrometers (0.0019 inches) per prism. The linear prisms have a height (h) in a range of between about, 20 and 100 micrometers (0.0008 and 0.004 inches) preferably about 25 micrometers (0.001 inches). The linear prisms have pointed peaks 206 with a peak angle ($\alpha$) as desired, with preferred values of 88 or 90 degrees in a sheeting. Base angles $\beta_1$ and $\beta_2$ can be the same or different. The linear prisms 204 can be attached to the base film 202 by an optional prism adhesive layer 208, such as 7650TC acrylic adhesive available from Bostik Chemical. Prism adhesive layer 208 has a thickness ($a_1$) in the range of between about 2.5 and 12 micrometers (0.0001 and 0.0005 inches).

On the non-prism side 210 of the base film 202, a pattern structure 212 is formed, such as with a resin composition similar to or the same as the prism side adhesive layer. The pattern structure 212 can be attached to the base film 202 by pattern adhesive layer 214, which is similar in material and thickness ($a_2$) to prism adhesive layer 208. Pattern structure 212 has a thickness in the range of between about 2.5 and 12 micrometers (0.0001 and 0.0005 inches).

Figure 9:
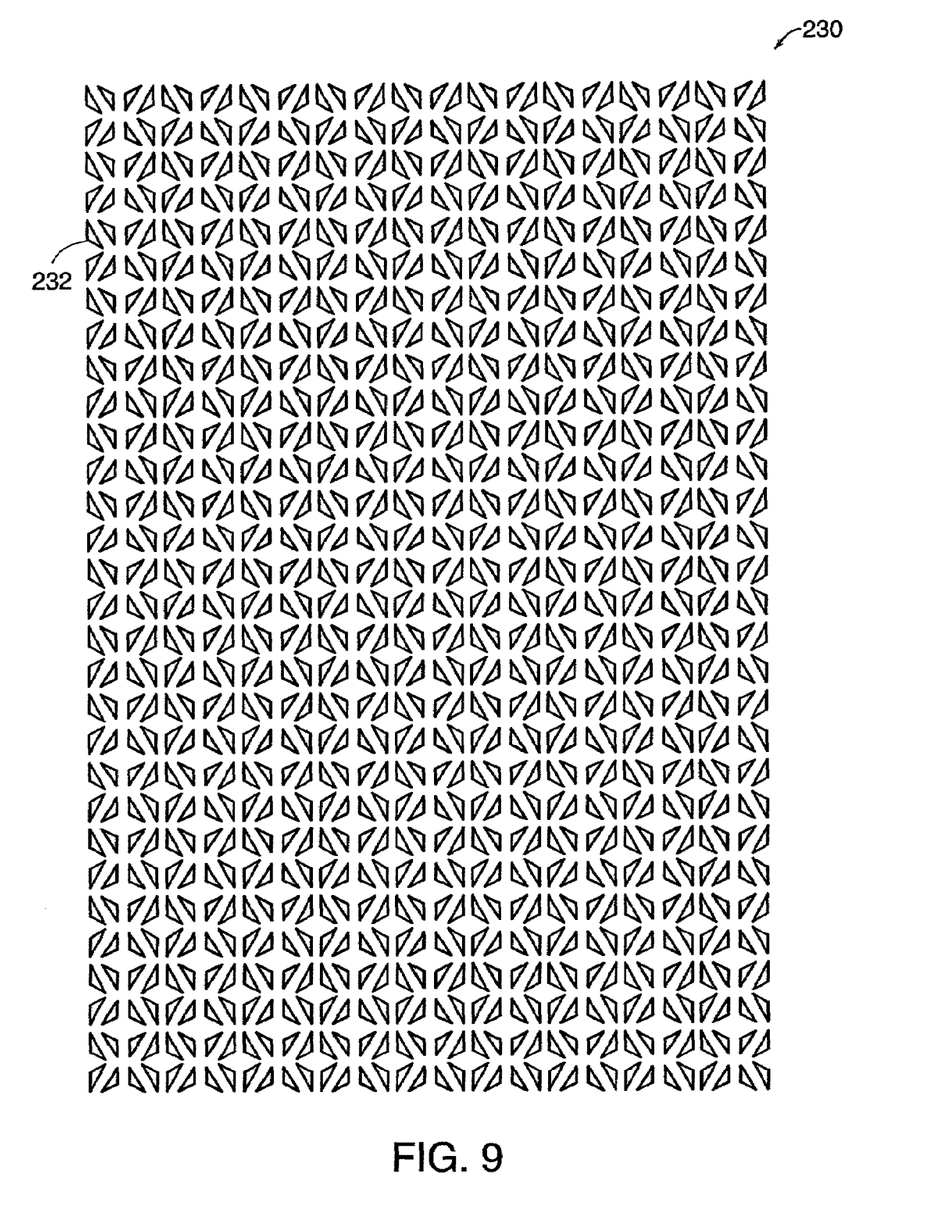
FIG. 9 shows an embodiment of a logo pattern.

As shown in FIG. 9, the pattern structure 230 includes a logo 232, which is an arrangement of four obtuse scalene triangles. The logo can be a company name, a trademark, a figure, or other desired design. The pattern structure can be printed on sheeting such as a polyester overhead projector sheeting by a laser printer. In the shown embodiment, the logo is repeated in a line on a first axis about every 13 mm. The logos in each line are off-set in the next by a half of a logo and the lines repeat about every 7.5 mm along a second axis in the run/web direction, which is perpendicular to the first axis. The lines of the logo are about 0.5 mm in width. Other types of designs include cross hatching, geometric figures, numerals, letters, etc.

Returning to FIG. 8, the lines are depressions 216 or recesses in the surface of the non-prism side. Depressions 216 can have a depth (d) in the range of between about 0.3 and 2.0 micrometers with an average depth of one micrometer. The depressions are not uniform in slope from edges 218 to low point 220. The depressions can have an average slope of 0.5 degrees to the surface of the base film 102 with the slope being as high as one degree.

The pattern structure is formed by placing a mask film temporarily on one side of the base film. The mask film has a logo, geometric form (lines, circles, curves, etc.), alphanumerics or any other desired design formed thereon that can block a portion of the ultraviolet light as it passes from ultraviolet light source through the mask film to the base film. The portion of the mask film without the logo printed thereon is more transparent to ultraviolet light. On the other side of the base film, an adhesive layer is deposited and an uncured radiation curable resin is placed on the adhesive layer. Ultraviolet light is directed from an ultraviolet light source through the mask layer through the base layer through the adhesive layer to the resin layer. The resin layer is differentially cured because the ultraviolet light intensity is blocked unevenly by the printed patterned to the resin layer resulting in the pattern structure. The pattern structure is uneven and segmented. The portions of the resin layer that have the greatest blockage from the ultraviolet light have the deepest depressions into the surface. The portions that were exposed to ultraviolet light resulted in segments with relatively flat surfaces. The mask film is then removed from the base film. The linear prisms are cast on the same side of the base film where the mask film had been placed. The linear prisms are cured by ultraviolet light directed through the base film. The linear prisms can be slightly differently cured in the portions that are exposed to the ultraviolet light that passes through the pattern structure that is uneven and segmented.

The film can be placed between a light guide and a display, such as a liquid crystal display. The fine pattern breaks-up the pixel pattern in the display without as much light loss as with a diffuser sheet. The pattern structure on the film can be readily visible across the film.

The film can be used as a single sheet or as a two-sheet or more system. A two-sheet system has the linear prisms peaks pointed in the same direction and the length of the peaks on each sheet are often crossed at ninety degrees.

EXAMPLE 1

Linear prisms were cast on polycarbonate and covered with a number 30LC mask film (manufactured by Ivex Packaging Corporation) that had a blue colored "PEEL" pattern printed on it. Moth-eye structures were cast on the opposite side of the prisms and cured by ultraviolet radiation at a web speed of about twelve meters per minute (forty feet per minute) past two 157-236 watts/lineal centimeter (400-600 Watts/lineal inch) ultraviolet lamps manufactured by Eye Ultraviolet Corporation. After removing the mask film, the cured moth-eye structures retained the "PEEL" pattern which could not be readily seen at a zero degree viewing angle but were pronounced at about a fifteen degree viewing angle.

EXAMPLE 2

Alphanumeric images were handwritten onto the surface of a mask film on a cling mask sample of polycarbonate film manufactured by Rowland Technologies Incorporated. Commonly available felt tip marker pens were used to form the images. An ultraviolet curable coating of epoxy acrylate was applied to the other side of the polycarbonate film and cured under a 236 Watts per lineal centimeter (600 Watts per lineal) inch lamp at about 4.6 meters per minute (fifteen feet per minute). The mask film was removed and the cured coating was visually examined at various angles. The images that had been on the mask film were visible at shallow viewing angles in the cured coating.

EXAMPLE 3

Figure 10:
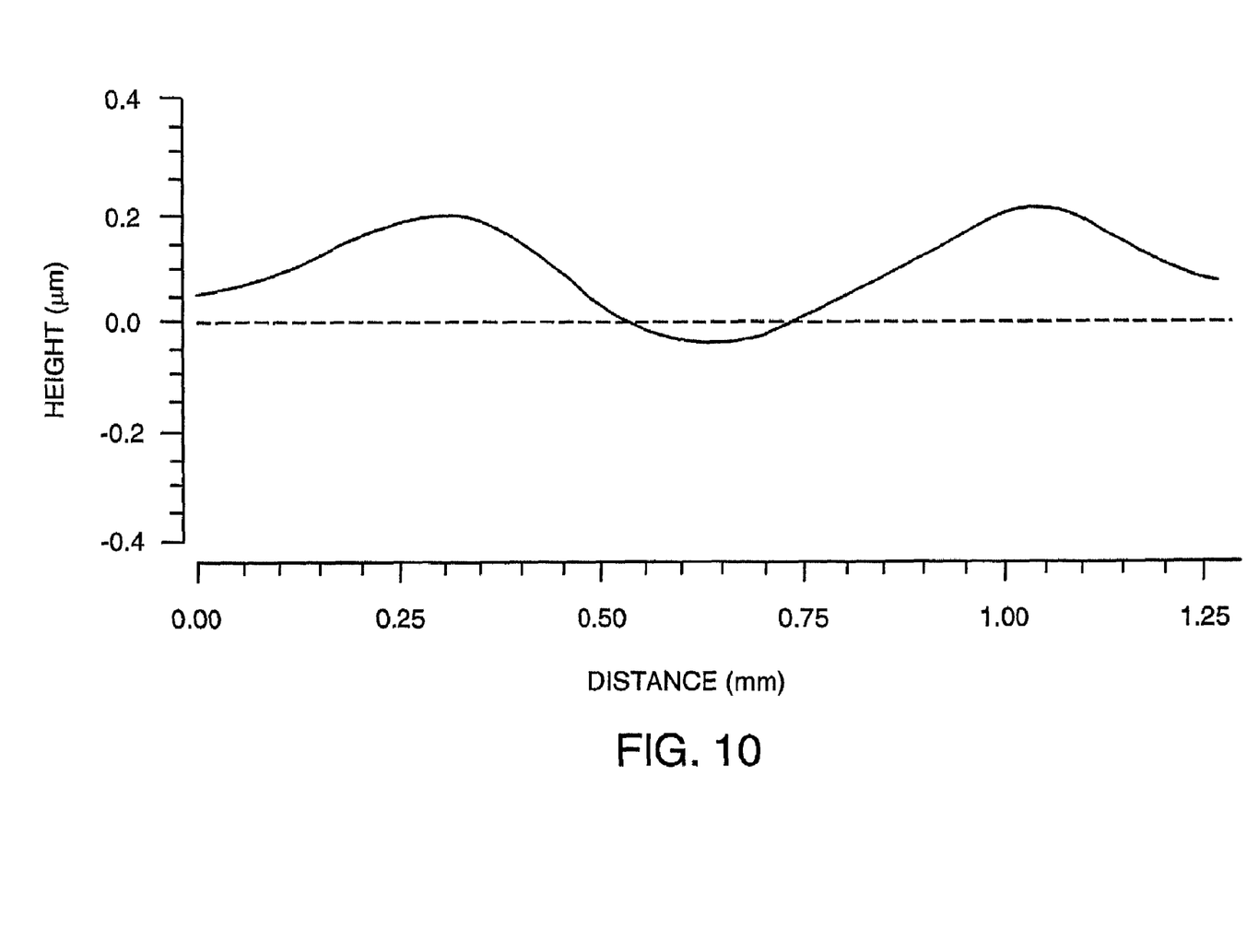
FIG. 10 shows a plot of a surface profile with an interference microscope trace which was made across the surface of a film made with the pattern transfer process.

FIG. 10 shows a plot of a surface profile with an interference microscope trace which was made across the surface of a film made with the pattern transfer process.

The height of the features is slightly less than one wavelength of red light. Red light wavelength is 632.8 nm ($2.49 \times 10^{-5}$ inches). The height of the features is approximately 500 to 900 nm ($1.9685 \times 10^{-5}$ to $3.5433 \times 10^{-5}$ inches). The average height is about 640 nm ($2.5197 \times 10^{-5}$ inches).

The height and slope of the features caused some light deviation as the light passes through the film. However, the effect on brightness appears to be positive by about a one percent gain. Additionally, these features can act as resting points for the prism peaks of collimating films as the films are stacked upon each other and therefore prevent the majority of the prism peaks from being damaged by abrasion.

While this invention has been particularly shown and described with references to preferred embodiments thereof, it will be understood by those skilled in the art that various changes in form and details may be made therein without departing from the scope of the invention encompassed by the appended claims.

What is claimed is:

1. A method for continuously forming an optical film from a radiation curable liquid material comprising:
   providing a mold that defines a shape for optical structures to be formed in the optical film;
   placing the radiation curable liquid material in the mold;
   positioning a radiation transparent base film adjacent to the radiation curable liquid material in the mold;
   positioning a radiation source such that it can irradiate the curable liquid material while the radiation curable material is in the mold;
   overlapping a mask film on a base film, the mask film being disposed between the radiation source and the base film, wherein the mask film comprises a pattern that further defines areas of the optical film where curved portions are to be made in the shape of the optical structures as would otherwise be defined by the mold alone; and
   simultaneously curing and patterning the liquid material by exposing it to the radiation source, wherein radiation passes through both the mask film and through the transparent base film at the same time, to reach the liquid material in the mold, and to thereby cure the liquid material and at the same time to pattern cured optical structures and further patterning the optical structures with the curved portions in their shape as a single step, the resulting curved optical structures thus being formed via differential exposure to radiation during the curing step, as caused by the mask film.

2. The method of claim 1 wherein the optical structure is formed in a surface of the optical film, opposite the base film.

3. The method of claim 1 wherein the radiation source emits ultraviolet light.

4. The method of claim 1 wherein the radiation curable liquid material is a monomer is selected from polyester, urethane, epoxy acrylates or methacrylates.

5. The method of claim 1 wherein the pattern is configured in the form of a logo, geometric form, or alphanumerics.

6. The method of claim 1 wherein the pattern is formed on the mask film.

7. The method of claim 1 wherein the radiation curable liquid is deposited between the base film and the mold.

8. The method of claim 7 wherein the pattern is removably placed on the base film.

9. The method of claim 1, wherein the optical structures comprise linear prisms, lenticular structures, cube-corner prisms, lens structures, and/or sub-wavelength structures.

10. The method of claim 1, wherein the optical structures are used in a display.

11. The method of claim 10, wherein the optical structures include a liquid crystal display.

12. The method of claim 1, wherein the pattern is used to mark the optical film.

13. A method for making a continuous optical film having parallel prism structures, the method comprising:

providing a rotating cylinder mold having linear grooves formed on an outer surface thereof, the linear grooves used as a mold for defining the parallel prism structures with aligned peaks;

dispensing a radiation curable liquid material onto the rotating cylinder mold at a dispensing location;

continuously feeding a radiation transparent optical base film and a mask film, the mask film having a pattern used in further defining features of the optical base film, near the dispenser location;

positioning the continuous mask film adjacent to the continuously fed optical base film near the dispensing location such that the optical base film and mask film are placed against the rotating mold, wherein the optical film is positioned nearest the rotating mold and the mask film is positioned outside of the optical base film;

providing a radiation source for simultaneously curing and patterning the liquid material by irradiating the liquid material through the adjacent mask film and optical base film, such that the radiation travels first through the mask film and then through the transparent optical base film before curing the liquid material, and such that the radiation source causes simultaneous patterning of the liquid material while the liquid material is being cured, to thereby define the optical base film including the prism structures having deformed peaks in an area of the liquid material blocked from the irradiation by the pattern;

separating the adjacent mask film and optical base film; and thereafter, individually collecting the optical base film and the mask film.

* * * * *